United States Patent [19]
Yew et al.

[11] Patent Number: 6,049,129
[45] Date of Patent: Apr. 11, 2000

[54] CHIP SIZE INTEGRATED CIRCUIT PACKAGE

[75] Inventors: Chee Kiang Yew; Yong Khim Swee; Min Yu Chan; Pang Hup Ong, all of Singapore, Singapore; Anthony Coyle, Plano, Tex.

[73] Assignee: Texas Instruments Incorporated, Dallas, Tex.

[21] Appl. No.: 08/994,627

[22] Filed: Dec. 19, 1997

[51] Int. Cl.[7] .................................................. H01L 23/48
[52] U.S. Cl. ......................... 257/737; 257/738; 257/778; 257/784; 257/787
[58] Field of Search ................................... 257/737, 738, 257/778, 787, 784

[56] References Cited

U.S. PATENT DOCUMENTS

| 3,179,913 | 4/1965 | Mittler et al. ............................. 339/18 |
| 3,370,203 | 2/1968 | Kravitz et al. ........................... 317/101 |
| 3,459,998 | 8/1969 | Focarile .................................... 317/100 |
| 3,904,934 | 9/1975 | Martin ...................................... 317/101 |
| 4,288,841 | 9/1981 | Gogal ....................................... 361/414 |
| 4,502,098 | 2/1985 | Brown et al. ............................ 361/383 |
| 4,574,331 | 3/1986 | Smolley ................................... 361/393 |
| 4,646,128 | 2/1987 | Carson et al. ............................. 357/74 |
| 4,727,410 | 2/1988 | Higgins, III ............................... 357/74 |
| 4,823,233 | 4/1989 | Brown et al. ............................ 361/383 |
| 4,833,568 | 5/1989 | Berhold .................................... 361/383 |
| 4,862,249 | 8/1989 | Carlson ..................................... 357/80 |
| 4,868,712 | 9/1989 | Woodman ................................ 361/388 |
| 4,953,005 | 8/1990 | Carlson et al. ............................ 357/80 |
| 5,016,138 | 5/1991 | Woodman ................................ 361/381 |
| 5,019,945 | 5/1991 | Smolley .................................... 361/412 |
| 5,739,585 | 4/1998 | Arkam et al. ............................. 257/737 |

*Primary Examiner*—Wael Fahmy
*Assistant Examiner*—Roy Potter
*Attorney, Agent, or Firm*—Mark A. Valetti; Carlton H. Hoel; Richard L. Donaldson

[57] ABSTRACT

An integrated circuit package (30) comprising a substrate (70) having an opening (86) and first and second surfaces (92, 94), a plurality of routing strips (82) being integral with the substrate (70) and extending to opening (86), a plurality of pads (100) disposed on the first surface (92) and electrically connected with at least one of the routing strips (82), a chip (50) having bonding pads (120) is adhered to the second surface (84) of the substrate (70) and is of substantially the same outline as substrate (70), wire bonding (80) electrically connecting at least one bonding pad (120) to at least one of the routing strips (82) and potting material (90) filling the opening (86) is disclosed.

36 Claims, 2 Drawing Sheets

CHIP SIZE INTEGRATED CIRCUIT PACKAGE

TECHNICAL FIELD OF THE INVENTION

The present invention relates in general to the field of integrated circuit packages and more specifically to substantially flat integrated circuit packages having substantially the same outline as the silicon chip.

BACKGROUND OF THE INVENTION

Without limiting the scope of the invention, its background is described in connection with integrated circuit packages, as an example.

Heretofore, in this field, integrated circuits have been formed on semiconductor wafers. The wafers are separated into individual chips and the individual chips are then handled and packaged. The packaging process is one of the most critical steps in the integrated circuit fabrication process, both from the point of view of cost and of reliability. Specifically, the packaging cost can easily exceed the cost of the integrated circuit chip and the majority of device failures are packaging related.

The integrated circuit must be packaged in a suitable media that will protect it in subsequent manufacturing steps and from the environment of its intended application. Wire bonding and encapsulation are the two main steps in the packaging process. Wire bonding connects the leads from the chip to the terminals of the package. The terminals allow the integrated circuit package to be connected to other components. Following wire bonding, encapsulation is employed to seal the surfaces from moisture and contamination and to protect the wire bonding and other components from corrosion and mechanical shock.

Conventionally, the packaging of integrated circuits has involved attaching an individual chip to a lead frame, where, following wire bonding and encapsulation, designated parts of the lead frame become the terminals of the package. The packaging of integrated circuits has also involved the placement of chips on a flexible board where, following adhesion of the chip to the surface of the flexible board and wire bonding, an encapsulant is placed over the chip and the adjacent flexible board to seal and protect the chip and other components.

Unfortunately, current methods for encapsulating silicon chips have led to various problems, including cracking between the encapsulation material and the integrated circuit components, as well as high failure rates due to the multi-step nature of the process. Cracking has plagued the industry because of differences in the coefficient of thermal expansion of the different components, for example, between the soldering materials at the different interfaces and between metallic and non-metallic components. Cracking is also frequent between the silicon wafer and the encapsulation materials, usually epoxies, due to the extreme variations in temperature in various environments and between periods of operation and non-operation.

Even if the encapsulated silicon chip is successfully assembled into a working integrated circuit, another problem is commonly encountered. Once the silicon chip is encapsulated it is typically surface mounted using radiant heat or vapor saturated heating. This process, however, can lead to poor coplanarity due to uneven reflow, leading to integrated circuit failure.

Therefore, a need has arisen for an integrated circuit package and a process for producing an integrated circuit package that provides for minimizing the size of integrated circuit packages. A need has also arisen for an integrated circuit package with a low profile and reduced outline that provides for maximum protection to the critical components of the integrated circuit package.

SUMMARY OF THE INVENTION

The present invention disclosed herein comprises an integrated circuit package and a process for producing an integrated circuit package that provides for an integrated circuit package with a low profile and a small outline. The integrated circuit package of the present invention also simplifies manufacturing and the design of underlying components that form part of an overall integrated circuit.

The integrated circuit package comprises a substrate having an opening, first and second surfaces and an outline. A plurality of routing strips are integral with the substrate. A plurality of pads are disposed on the first surface, at least one of the pads being electrically connected with at least one of the routing strips. A chip is adhered to the second surface of the substrate. The chip has an outline that is substantially the same as the outline of the substrate. The chip has at least one bonding pad. Wire bonding electrically connects the bonding pad to a routing strips.

At least one bus bar is integral with the substrate. The bus bar is electrically connected to a bonding pad and at least one the pads disposed on the first surface of the substrate. Potting material fills the opening to cover the wire bonding and the bonding pads. Solder balls are disposed on the pads disposed on the first surface of the substrate to enable attachment to other devices.

The solder balls may preferably have a diameter between about 8 and 20 mils. The chip may preferably have a thickness between about 10 and 20 mils. In one embodiment, potting material encapsulates the chip adding a thickness of about 6 mils. The substrate may preferably have a thickness between about 8 and 28 mils. In a single layer embodiment, the substrate may have a thickness of about 12 mils. In a multi-layer embodiment where the bus bars and the routing strips may be disposed in the opening of the substrate, a first layer may have a thickness of about 12 mils and a second layer may have a thickness of about 8 mils. Alternatively, a first layer may have a thickness of about 12 mils, a second layer may have a thickness of about 8 mils and a third layer may have a thickness of about 8 mils.

The profile of the integrated circuit package of the present invention may preferably be between about 40 mils and 50 mils. More specifically, the profile of the integrated circuit package of the present invention may preferably be about 41 mils, about 44 mils, about 47 mils or about 50 mils.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The present invention is related to high frequency integrated circuits having both a low profile and a small outline. As defined herein, the term "outline" relates to the overall width and length of the integrated circuit of the present invention. The outline of the integrated circuit is also referred to as the footprint of the integrated circuit, because it defines the surface area on a motherboard that the integrated circuit will occupy. Outline may be measured, in for example, square mils or square millimeters.

As defined herein, the term "profile" refers to the thickness or height of the integrated circuit of the present invention, and may be measured in, for example, mils. As defined herein, the term "substantially similar" refers to the relative outlines of the printed circuit board and the silicon chip which are within less about 10% of one another other. In one embodiment of the present invention, the difference in the size of the outlines is about 2%. In an alternative embodiment, the silicon chip and the printed circuit board are the same size. Importantly, the term substantially similar does not indicate which of the two components is larger, as either form is encompassed by the present invention.

The present invention provides for an integrated circuit package that delivers high speed performance and meets the space constraint requirements of modern semiconductors. The present invention also addresses the problems associated with the electronic capacity of the chip assembly. The principles of the present invention may be incorporated into, for example, a synchronous DRAM (SDRAM) silicon chip. However, the present invention is also applicable to LOGIC, SRAM, EPROM and any other integrated circuit components.

Figure 1:
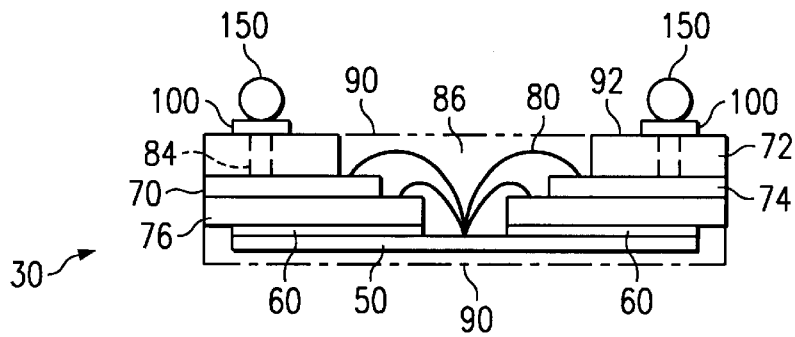
FIG. 1 is a simplified end cross-sectional view of an integrated circuit package of the present invention.

FIG. 1 is a simplified cross-sectional view of an integrated circuit package that is generally designated 30. The integrated circuit package 30 comprises a silicon chip 50, which can be, for example, any integrated circuit component such as a DRAM, an EPROM, a SRAM or a LOGIC chip. A printed circuit board 70 is attached to the silicon chip 50 by an adhesive layer 60. The adhesive layer 60 may be made of, for example, a double-sided adhesive polyimide tape, adhesive glue or epoxy. The printed circuit board 70 consists of three layers, a top layer 72, an intermediate layer 74, and a bottom layer 76.

The printed circuit board 70 may be constructed from a material such as FR-4 which is available from, for example, Motorola Inc., U.S.A. FR-4 is an epoxy resin reinforced with a woven glass cloth. In selecting the material for printed circuit board 70, one skilled in the art will recognize that four parameters should be considered, namely, thickness, dielectric constant, glass transition temperature and the coefficient of thermal expansion.

Thickness is dependant on the number of layers required and the amount of reinforcement used in a given layer. The reinforcing glass cloth can range in thickness from 2 mil per sheet (type 106) to about 8 mil per sheet (type 7628). Dielectric constant is determined by a combination of the resin used and the thickness and type of reinforcement used. Standard FR-4 has a dielectric constant of about 4.5. This constant can be reduced to about 3 by replacing the epoxy resin with a cyanate ester resin. The greater the thickness, however, the greater the problems associated with thickness control, rough surfaces, excessive drill reflection and poor resin refill.

The temperature at which a resin changes from a glass-like state into a "rubbery" state is generally designated as $T_g$. Standard FR-4 is made with a bifunctionally polymerizing epoxy that has a $T_g$ of about 110° C. Higher $T_g$ temperatures, such as 125–150° C. may be withstood by using a tetrafunctional epoxy. For higher $T_g$ values, in the range of 150 to 200° C. a cyanate ester:epoxy blend can be used. Additionally, polyimides provide for printed circuit boards having a $T_g$ above 250° C.

The coefficient of thermal expansion for FR-4 is about 16 ppm/°C. A difference in the coefficient of thermal expansion between the printed circuit board 70 made from FR-4 and the silicon chip 50 can lead to failure of the integrated circuit package 30 during, not only the assembly of the integrated circuit package 30, but also during the use of integrated circuit package 30.

The adhesive layer 60 may be Hitachi HM122u. Alternatively, the silicon chip 50 can be adhered to the printed circuit board 70 with a die bonding film such as HIATTACH-335 (DF-335) manufactured by Hitachi Chemical Company of Tokyo, Japan. HIATTACH-335 (DF-335) is silver filled thermosetting type resin film for die-attaching. The bonding process generally involves attaching the film on the printed circuit board 70 at 160 C. for 5 seconds with an applied force of 1000–3000 grams; then attaching the silicon chip 50 on the film at 220 C. for 5 seconds under a force of 150–200 grams.

| Test | Remarks | Units | DF-335 |
|---|---|---|---|
| DF-335 has the following properties | | | |
| Appearance | Visual | — | silver film |
| Solid Content | 200 C.-2 h | wt % | 96 |
| Ash Content | 600 C.-1.5 h | wt % | 40 |
| Ash Content/Solid | 600 C.-1.5 h | wt %/solid | 42 |
| Thickness | Dial gauge | m | 25 |
| Tensile Strength | R.T. | kgf/mm$^2$ | 7.1 |
| Tensile Modulus | R.T. | kgf/mm$^2$ | 271 |
| Die shear strength | 4 × 4 mm chip/Ag plated alloy 42 | kgf/chip | |
| R.T. | | | 10 |
| 250 C. | | | 0.9 |
| Peel strength 240 C. (after/85 C. 85%, 48 h) | 8 × 8 mm chip/bare alloy 42 | kgf/chip | 3.0 |
| Tg | TMA, 180 C.-1 h cured | C. | 123 |
| Modulus | Viscoelastic spectrometer | Mpa | 1300 |
| Moisture | 85 C./85% RH, 48 h | wt % | 0.1 |

Other examples of adhesives include thermosetting adhesives, such as epoxies, polyimides and silicone. Thermoplastic adhesives that are hot-melted, in the form of sheets or as a pressure sensitive adhesive tape may also be used to adhere silicon chip 50 to the printed circuit board 70. Commonly used are adhesive tapes based on elastomers, silicones or acrylics because of their ease of use and easy incorporation into production.

Figure 2:
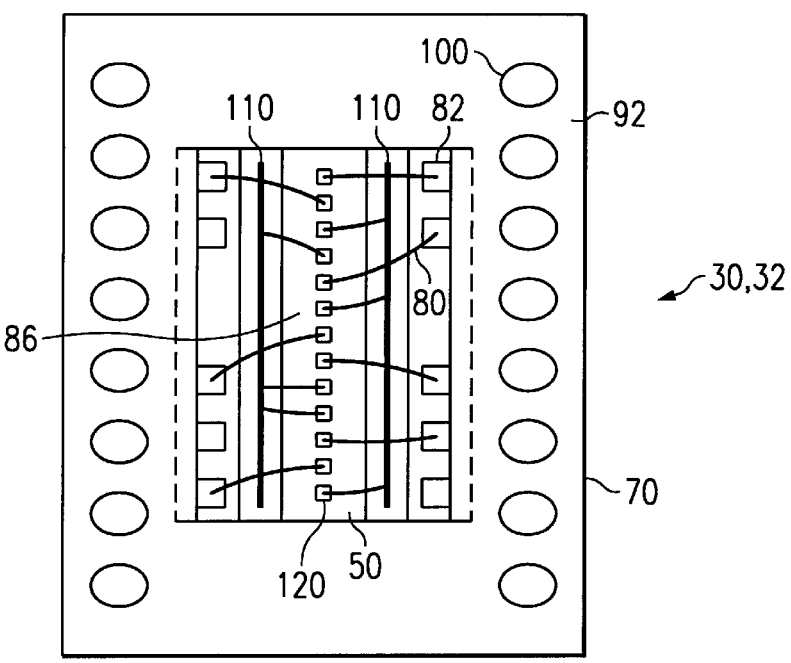
FIG. 2 is a simplified top view of an integrated circuit package of the present invention.

Referring collectively to FIGS. 1 and 2, intermediate layer 74 has routing strips 82 that are electrically connected through vias 84 to pads 100 located on top surface 92 of top layer 72. It should be understood by one skilled in the art that the terms "top" and "bottom" as well as the terms "side" and "end" are used for illustration purposes only, as the integrated circuit package 30 of the present invention can be assembled and used in a variety of positions and ways. Intermediate layer 74 includes a pair of bus bars 110. The bus bars are electrically connected through vias 84 to one or more of the pads 100. The bus bars 110 may serve, for example, as power supplies or grounds, and it is preferred that one bus bar 110 serve one function, such as a power supply, and the second bus bar 110 serve another function, such as a ground.

The silicon chip 50 has bonding pads 120 located generally in the central area of silicon chip 50. The bonding pads 120 are connected to routing strips 82 and bus bars 110 by wire bonding 80. The bus bars 110 may be insulated before stitching of the wire bonding 80. Disposed on pad 100 is a solder ball 150.

The solder balls 150 used with the present invention may be attached to the pads 100 using conventional solder reflow systems. For example, a vapor phase solder reflow system may be used, which condenses vapor to surround the integrated circuit package 30 and the printed circuit board 70 with a cloud of steam. A liquid, such as a nonchlorinated (non CFC) fluorocarbon is first heated with enough energy to form a vapor and to sustain a vapor cloud. When the integrated circuit package 30 is then passed through the vapor, the vaporized liquid condenses thereon and gives off the latent heat of vaporization. This energy is then transferred to the integrated circuit package 30. As long as the integrated circuit package 30 remains in the vapor, the vapor continues to give off energy at a repeatable fixed rate and temperature, until the integrated circuit package 30 reaches the temperature of the vapor.

The advantage of using a nonchlorinated fluorocarbon is that it is extremely thermally stable, colorless, odorless and nonflammable. In addition, it has a low toxicity, low surface temperature, low boiling point, and low heat of vaporization. Because the fluid form of the non-chlorinated fluorocarbon is inert, it does not react with fluxes or component materials, nor does it absorb oxygen or other gases that cause reactions during the solder reflow. Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the temperature profiles of non-chlorinated fluorocarbons that are used as vapor fluids is shown below.

| Vaporization Temperatures and Solder Types | |
|---|---|
| Fluid Temperature | Solder Type |
| 56, 80, 97, 101, 102 C. and 155 C. | 100 In |
| | 37 Sn/38 Pb/25 In |
| 165 C. | 70 Sn/18 Pn/12 In |
| | 70 In/30 Pb |
| 174 C. | 60 In/40 Pb |
| 190 C. | 90 In/10 Ag |
| | 50 In/50 Pb |
| | 63 Sn/37 Pb |
| | 70 Sn/30 Pb |
| | 60 Sn/40 Pb |

| -continued | |
|---|---|
| Vaporization Temperatures and Solder Types | |
| Fluid Temperature | Solder Type |
| 215 C. and 230 C. | 60 Sn/40 In |
| | 60 Sn/40 Pb |
| | 63 Sn/37 Pb |
| | 70 Sn/30 Pb |
| | 62 Sn/36 Pb/2 Ag |
| 240 C. and 253 C. | 75 Pb/25 In |
| | 81 Pb/19 In |
| 260 C. and 265 C. | 96.5 Sn/3.5 Ag |

Alternatively, infrared or radiant heated solder reflow may be used. In such a system each component of the soldering system is directly exposed to radiation from a heating element. Heat from the radiant energy element is absorbed by the different components according to its molecular structure.

Conventional radiant heat systems expose only the outer surfaces of the components to the radiant heat, which may not reach interior areas as efficiently as with vapor saturated heating methods as described above. The present invention, however, is not affected by this typical problem because of the use of solder balls 150 instead of leads. In fact, due to the reduced overall size either method, vapor phase solder reflow or radiant heated solder reflow, may be effectively used with the present invention.

The present invention also solves other problems associated with solder reflow systems. These problems include the creation or failure due to voids, coplanarity, tombstoning, open joints, component cracking, thermal shock and thermal stressing. The present invention solves these problems because it dispenses with the need for electrically connecting soldering leads to the integrated circuit package 30. By using solder balls 150 instead of leads, the problems associated with voids around pad areas or under leads caused by incomplete reflow or poor welding of the soldering surface due to improper flux or badly oxidized surfaces is eliminated. The problems of coplanarity and tombstoning are also reduced or eliminated using the solder balls 150 because surface tension on both sides of the solder balls 150 is equal.

Even though FIG. 1 depicts printed circuit board 70 as having three layers 72, 74, and 76, it should be understood by one skilled in the art that printed circuit board 70 may consist of a single layer or may be a multi-layered board having an alternate number of layers. Such embodiments are shown here as FIGS. 4 and 6.

The above described components and their constructions and interrelation provide an assembly that is encapsulated as described below. The term "assembly" refers to the assembled components prior to encapsulation. The assembly consists of printed circuit board 70, adhered silicon chip 50 and wire bonding 80. The printed circuit board 70 has an opening 86 with routing strips 82 and bus bars 110 extending into, or to, the opening 86. Disposed on pads 100 are solder balls 150.

The wire bonding 80 process may begin after silicon chip 50 has been adhered to printed circuit board 70. Silicon chip 50 and printed circuit board 70 are then positioned on a heated pedestal to raise the temperature of the combination to a point between 100–300 C. A gold wire having a diameter typically ranging from 0.7 mil. to 1.3 mil. is strung through a heated capillary where the temperature may range between 200–500 C. A gold or silver bond wire soldering ball is created at the end of the wire using either a flame or a spark technique. This golod or silver soldering ball is then brought to bonding pad 120 on the silicon chip 50 and a combination of compression force and ultrasonic energy are used to create the desired metallurgical bond. Using this "stitch" technique significantly reduces the cross-section of the wire at that point. A loop is created in the wire bonding 80 above the bond that has just been achieved, and the wire bonding 80 is routed to the desired connection on the printed circuit board 70 such as routing strip 82 or bus bar 110. The wire bonding 80 is clamped and the capillary raised, such that the wire bonding 80 will break free at the outer edge of the bond. This process is repeated until all the bonding pads 120 that require electrical connection on the silicon chip 50 are electrically connected to printed circuit board 70.

Following the assembly of the above-described components, the opening 86 is filled with potting material 90 as represented by the dashed line above opening 86. As an alternative, printing material may be used instead of the potting material. The potting material 90 may also be used to thinly encapsulate the silicon chip 50, for example, with a layer having a thickness of between about 4 and 12 mils. In one embodiment the thickness of the encapsulating potting material layer is 6 mils.

The potting material 90 may be a cyanate ester-type resin available from Shin-Etsu Chemical Co., Ltd., such as KMC 184VA and KMC 188VA-4. Other examples of potting materials 90 that may be used with the present invention include epoxies, polyesters, polyimides, cyanoacrylates, ceramic, silicone and urethane. The potting materials 90 may also contain fillers that affect the coefficient of thermal expansion, as well as the strength and flexibility of the potting material 90. The selection of potting material 90 and fillers will depend on the components used to make the integrated circuit package 30, as will be known to those of skill in the art.

| Properties of Typical Potting Resins | | | | |
|---|---|---|---|---|
| | Epoxy | Polyester | Silicone | Urethane |
| Dielectric constant, D-150 | | | | |
| 60 Hz | 3.9 | 4.7 | 2.7 | 5.7 |
| $10^6$ Hz | 3.2 | — | 2.7 | 3.4 |
| Dissipation factor, D-150 | | | | |
| 60 Hz | 0.04 | 0.017 | 0.001 | 0.123 |
| $10^6$ Hz | 0.03 | — | 0.001 | 0.03 |
| Dielectric strength, D-149; V/mil | 450 | 325 | 550 | 400 |
| Volume resistivity, D-257; cm | $10^{15}$ | $10^{14}$ | $10^{15}$ | $10^{13}$ |
| Arc resistance, D-495; seconds | 150 | 135 | 120 | 180 |
| Specific gravity, D-792 | 1.15 | 1.2 | 1.05 | 1.0 |
| Water absorption, D-570; % 24 h | 0.15 | 0.3 | 0.12 | 0.4 |
| Heat deflection temperature, D-648; at 264 lb/in$^2$, F. | 380 | 260 | <70 | <70 |
| Tensile strength, D-638; lb/in$^2$ | 9000 | 10,000 | 1000 | 2000 |
| Impact strength (Izod), D-256; ft lb/in | 0.5 | 0.3 | No break | No break |
| Coefficient of thermal expansion, D-969; $10^{-5}$/F. | 5.5 | 7.5 | 4.0 | 15 |
| Thermal conductivity, C-177; Btu in/(h ft$^2$ F.) | 1.7 | 1.7 | 1.5 | 1.5 |
| Linear shrinkage; % | 0.3 | 3.0 | 0.4 | 2.0 |
| Elongation, D-638; % | 3 | 3 | 175 | 300 |

Although the board-on-chip layout of integrated circuit package 30 as depicted in FIGS. 1 and 2 has been described using centralized bonding pads 120, it should be understood by one skilled in the art that the principles of the present invention are applicable to a silicon chip 50 with bonding pads 120 in alternate layouts such as positioned along the sides of the silicon chip 50.

Also, it should be noted by one skilled in the art that pads 100 and bus bars 110 may be located on a single layer of printed circuit board 70. Generally, a layer of insulated tape or coating may be placed on the bus bars 110 to provide for electrical isolation. The advantage of a multi-layer printed circuit board 70, however, is the elimination of the need to insulate the bus bars 110. Additionally, the multi-layer printed circuit board 70 provides a greater process margin for wire bonding.

Figure 3:
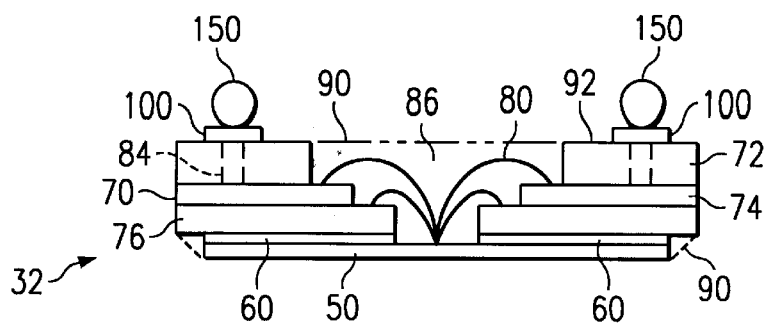
FIG. 3 is a simplified end cross-sectional view of an integrated circuit package of the present invention.

FIG. 3 is a simplified cross-sectional view of an integrated circuit package that is generally designated 32. The integrated circuit package 32 comprises a silicon chip 50 and a printed circuit board 70 which is attached to the silicon chip 50 by an adhesive layer 60. In this embodiment, the printed circuit board 70 consists of three layers, a top layer 72, an intermediate layer 74 and a bottom layer 76. The printed circuit board 70 has an opening 86.

As best seen in conjunction with FIG. 2, routing strips 82 and bus bars 110 extend into the opening 86. After assembly, opening 86 is filled with potting material 90 as represented by the dashed line above opening 86 and around silicon chip 50. Vias 84 electrically connect pads 100 located on top surface 92 of top layer 72 to the routing strips 82 and bus bars 110. In this embodiment, the back side of the silicon chip 50 is exposed which improves thermal dissipation and simplifies the assembly process.

Figure 4:
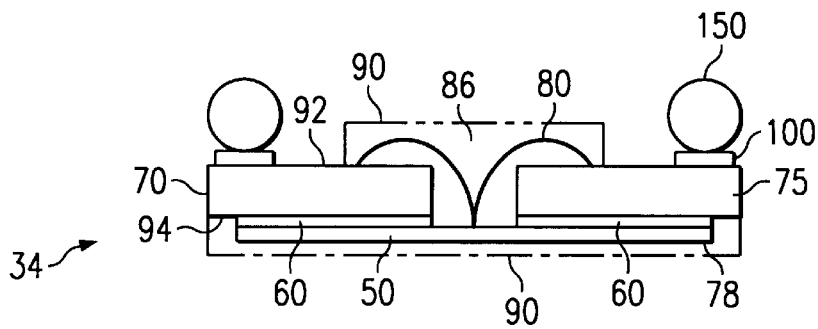
FIG. 4 is a simplified end cross-sectional view of an integrated circuit package of the present invention.

FIG. 4 is a simplified cross-sectional view of an integrated circuit package that is generally designated 34. The integrated circuit package 34 comprises a silicon chip 50, and a printed circuit board 70 attached to the silicon chip 50 by an adhesive layer 60. The printed circuit board 70 depicted in FIG. 4 consists of a single layer 75.

Figure 5:
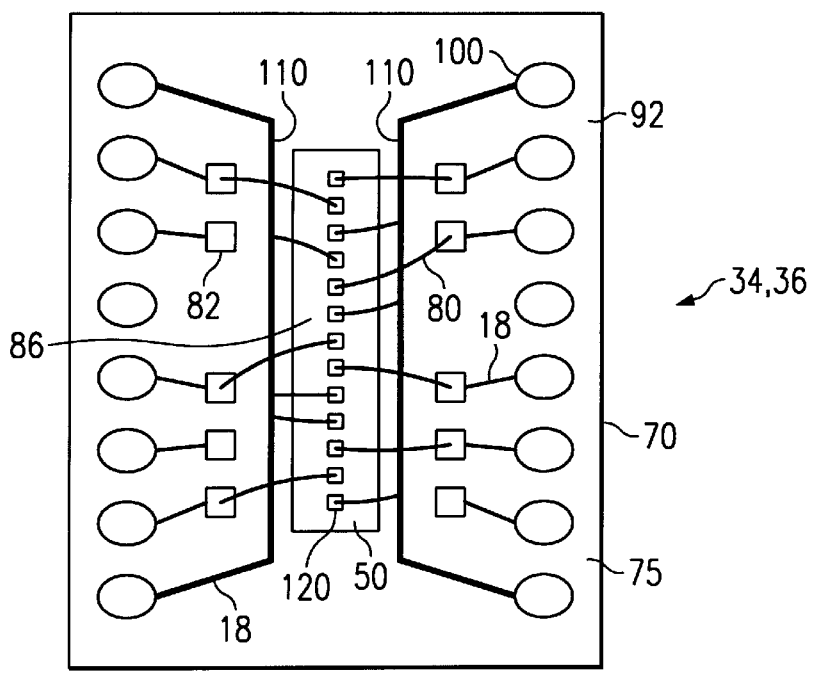
FIG. 5 is a simplified top view of an integrated circuit package of the present invention.

The printed circuit board 70 may be constructed from a material such as FR-4. The thickness of the printed circuit board 70 may be of about 12 mils. Referring collectively to FIGS. 4 and 5, layer 75 has routing strips 82 that are electrically connected to pads 100 located on top surface 92. Layer 75 also includes a pair of bus bars 110 that are electronically connected to pads 100.

The silicon chip 50 has bonding pads 120 located generally in the central area of silicon chip 50. The bonding pads 120 are connected to routing strips 82 and bus bars 110 by wire bonding 80 through opening 86.

Due to the nature of a single layer 75, the bus bars 110 may be electrically insulated before stitching of the wire bonding 80. The potting material 90 is used to cover the wire bonding 80 and will therefore rise over the top surface 92. The thickness of the solder ball 150, therefore, must exceed the thickness of the potting material 90 extending above top surface 92. The silicon chip 50 in FIG. 4 may be encapsulated by a potting material 90.

Integrated circuit package 30 is shown having a layer 75 with routing strips 82. Routing strips 82 are electrically connected to pads 100 by conduits 18 located on top surface 92 of layer 75. Layer 75, as depicted in FIG. 5, includes a pair of bus bars 110. The bus bars 110 are electrically connected by conduits 18 to one or more of the pads 100. As described hereinabove in reference to FIG. 2, bus bars 110 may serve, for example, as power supplies or grounds. The silicon chip 50 has bonding pads 120 located generally in the central area of silicon chip 50. The bonding pads 120 are connected to routing strips 82 and bus bars 110 by wire bonding 80.

Figure 6:
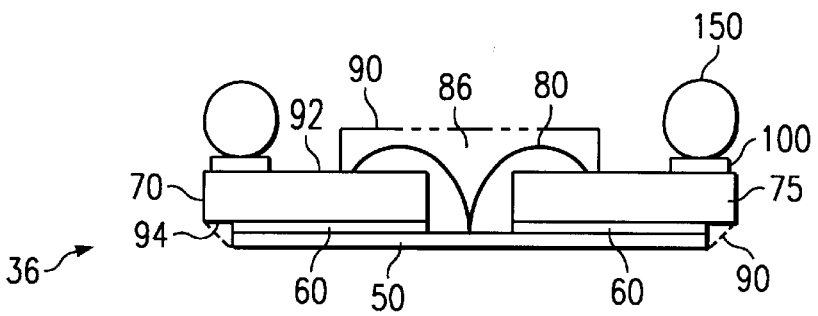
FIG. 6 is a simplified end cross-sectional view of an integrated circuit package of the present invention.

FIG. 6 is a simplified cross-sectional view of an integrated circuit package that is generally designated 36. The integrated circuit package 36 comprises a silicon chip 50 and a printed circuit board 70 which is attached to the silicon chip 50 by an adhesive layer 60. In this embodiment, the printed circuit board 70 consists of a single layer 75. The printed circuit board 70 has an opening 86. As best seen in conjunction with FIG. 5, routing strips 82 and bus bars 110 are printed on the top surface 92 of printed circuit board 70. After assembly, opening 86 is filled with potting material 90 as represented by the dashed line above opening 86 and around silicon chip 50. Pads 100 located on top surface 92 of layer 75 are connected to solder balls 150.

The electrical connections between silicon chip 50 and printed circuit board 70 occur through the opening 86. Bonding pads 120 located generally in the central area of silicon chip 50 are connected to routing strips 82 and bus bars 110 by wire bonding 80.

Due to the nature of a single layer 75, the bus bars 110 may be insulated before stitching of the wire bonding 80. The potting material 90 is used to cover the wire bonding 80 and will therefore rise over the first surface 92. The thickness of the solder ball 150, therefore, must exceed the thickness of the potting material 90 over top surface 92. The silicon chip 50 in FIG. 6 can be encapsulated by a potting material 90 located on the edges of silicon chip 50 on the bottom surface 94 of printed circuit board 70. The back of silicon ship 50, therefore, is exposed which leads to improved thermal dissipation.

Importantly, the printed circuit boards 70 depicted in FIGS. 1, 3, 4 and 6 are designed to have substantially the same outline as the silicon chip 50. Outline, as used herein, describes the length and width of the silicon chip 50, which may also be referred to as the footprint of the integrated circuit package 30, 32, 34 and 36. The length of the integrated circuit package 30 may be between about 500 and 800 mils, with a length of about 608 mils being preferred. The width, on the other hand, may be between about 200 and 500 mils, with a width of about 258 mils being preferred. The similarity in length and width between the printed circuit board 70 and the silicon chip 50 is possible due to the internal positioning of the electrical connections between the silicon chip 50 and the printed circuit board 70 by "stitching" wire bonding 80 through the opening 86.

Profile, as used herein, describes the overall thickness of the integrated circuit package 30, 32, 34 and 36. A variety of factors will affect the overall profile of the integrated circuit package 30, such as the number of layers that comprise the printed circuit board 70. When the printed circuit board 70 has three layers 72, 74 and 76, as in FIGS. 1 and 3, the profile of the layers 72, 74 and 76 is of about 20–30 mils. By contrast, FIGS. 5 and 6 have a single layer printed circuit board 75, and may have a profile of about 12 mils. A double layer printed circuit board may have a profile of about 20 mils. The silicon chip 50 described herein has a profile of about 14 mils when not encapsulated, and of about 20 mils when 6 mils of potting material 90 is added to encapsulate the silicon chip 50. The final component of the profile is the diameter of the solder balls 150, and the adhesive layer 60.

Using the diameter of the solder balls 150 as an example, the skilled artisan will appreciate that solder balls 150 may be placed on the pads 100. The diameter of the solder balls 150, and their composition, will depend on the overall profile requirements of the integrated circuit package 30, 32, 34 and 36, and its intended purpose. The diameter of the solder balls 150 will also depend on whether the potting material 90 is used only to cover the wire bonding 80 within the opening 86 of the printed circuit board 70, or if the potting material 90 is allowed to extrude beyond the opening 86 above the plane of top surface 92. In the later case, where the potting material 90 over fills opening 86, the diameter of solder balls 150 may have to be increased to compensate for the added profile of potting material 90, as shown in FIGS. 4 and 6. On the other hand, if the potting material 86 does not completely fill the opening 86, as in FIGS. 1 and 3, or is flush with the first surface 92, then the diameter of the solder ball 150 may be, for example, 10 mils.

In the embodiment of FIG. 1, integrated circuit package 30 may have an overall profile of about 50 mils, 20 mils from the silicon chip 50 and its potting material 90, 20 mils from the printed circuit board 70, and 10 mils from the solder balls 150.

The integrated circuit package 32 depicted in FIG. 3 may have an overall profile of about 44 mils. The overall profile of about 44 mils, comes from 14 mils of silicon chip 50, 20 mils from printed circuit board 70, and 10 mils from solder balls 150.

The integrated circuit package 34 depicted in FIG. 4 may have an overall profile of about 47 mils. The overall profile of integrated circuit 34 comes from, 20 mils of silicon chip 50 and its potting material 90, 12 mils from printed circuit board 70, and 15 mils from solder balls 150.

The overall profile of integrated circuit package 36, depicted in FIG. 6 is of about 41 mils. The overall profile of about 41 mils comes from, 14 mils of silicon chip 50, 12 mils from printed circuit board 70, and 15 mils from solder balls 150.

The present invention, therefore, is directed toward an integrated circuit package 30, 32, 34 and 36, having an overall reduction in outline and profile. The present invention also allows for decreased failure due to the reduced number of soldered materials having varying coefficients of thermal expansion. The present invention further reduces the overall number of steps in the assembly of, for example, memory units by streamlining the assembly process not only in reduced number of steps, but also by elimination the curing steps associated with encapsulating integrated circuit. The present invention further reduces the amount of material used in producing integrated circuit packages 30,32, 34 and 36, thereby saving time, money and the environment.

Furthermore, the method of the present invention takes advantage of the opening 86 at the center of the printed circuit board 70 for potting the wire bonding 80 that connects the silicon chip 50 and the printed circuit board 70 in a single step. By filling the opening 86 with potting material 90, the wire bonding 80 between silicon chip 50 and the printed circuit board 70 are generally protected from the environment and are particularly protected from moisture due to the hermetic nature of the encapsulation.

This means of potting the integrated circuit package 30 32, 34 and 36, of the present invention greatly reduces the overall profile by allowing the non-operative or backside of the silicon chip 50 to be exposed. By hermetically protecting the connections between the silicon chip 50 and the printed circuit board 70 at the opening 86, there is no need to completely encapsulate the entire assembly.

Additionally, reduced environmental impact is obtained using the method and apparatus of the present invention due to the overall decrease in the size of the integrated circuit package 30.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit package comprising:
    a substrate having an opening, first and second surfaces and an outline;
    a plurality of routing strips being integral with said substrate;
    a plurality of pads disposed on said first surface, at least one of said pads being electrically connected with at least one of said routing strips;
    a chip adhered to said second surface of said substrate, said chip having an outline that is substantially the same as said outline of said substrate, said chip having at least one bonding pad;
    wire bonding electrically connecting said at least one bonding pad to at least one of said routing strips; and
    potting material filling said opening to cover said wire bonding and said at least one bonding pad.

2. The integrated circuit package as recited in claim 1 wherein said substrate includes at least one bus bar being integral with said substrate, said at least one bus bar electrically connected to at least one of said bonding pads and at least one said pads disposed on said first surface of said substrate.

3. The integrated circuit package as recited in claim 2 wherein said at least one bus bar and said routing strips are disposed in said opening.

4. The integrated circuit package as recited in claim 1 further comprising at least one solder ball disposed on at least one of said pads disposed on said first surface of said substrate.

5. The integrated circuit package as recited in claim 4 wherein said at least one solder ball is between about 8 and 20 mils in diameter.

6. The integrated circuit package as recited in claim 4 wherein said at least one solder ball is about 10 mils in diameter.

7. The integrated circuit package as recited in claim 4 wherein said at least one solder ball is about 15 mils in diameter.

8. The integrated circuit package as recited in claim 1 wherein said chip has a thickness between about 10 and 20 mils.

9. The integrated circuit package as recited in claim 1 wherein said chip has a thickness of about 14 mils.

10. The integrated circuit package as recited in claim 1 wherein said potting material encapsulates said chip and wherein said potting material has a thickness of about 6 mils.

11. The integrated circuit package as recited in claim 1 wherein said substrate has a thickness of between about 8 and 28 mils.

12. The integrated circuit package as recited in claim 11 wherein said substrate has a thickness of about 12 mils.

13. The integrated circuit package as recited in claim 11 wherein said substrate has first and second layers and wherein said first layer has a thickness of about 12 mils and said second layer has a thickness of about 8 mils.

14. The integrated circuit package as recited in claim 11 wherein said substrate has first, second and third layers and wherein said first layer has a thickness of about 12 mils, said second layer has a thickness of about 8 mils and said third layer has a thickness of about 8 mils.

15. The integrated circuit package as recited in claim 1 wherein the overall profile of said package is between about 40 mils and 50 mils.

16. The integrated circuit package as recited in claim 1 wherein the profile of said package is about 41 mils.

17. The integrated circuit package as recited in claim 1 wherein the profile of said package is about 44 mils.

18. The integrated circuit package as recited in claim 1 wherein the profile of said package is about 47 mils.

19. The integrated circuit package as recited in claim 1 wherein the profile of said package is about 50 mils.

20. An integrated circuit package comprising:
    a substrate having an opening, first and second surfaces and an outline;
    a plurality of routing strips being integral with said substrate;
    a plurality of pads disposed on said first surface, at least one of said pads being electrically connected with at least one of said routing strips;
    a chip adhered to said second surface of said substrate, said chip having an outline that is substantially the same as said outline of said substrate, said chip having at least one bonding pad;
    wire bonding electrically connecting said at least one bonding pad to at least one of said routing strips;
    at least one bus bar being integral with said substrate, said at least one bus bar electrically connected to at least one of said bonding pads and at least one said pads disposed on said first surface of said substrate;
    potting material filling said opening to cover said wire bonding and said at least one bonding pad; and
    at least one solder ball disposed on at least one of said pads disposed on said first surface of said substrate.

21. The integrated circuit package as recited in claim 20 wherein said at least one bus bar and said routing strips are disposed in said opening.

22. The integrated circuit package as recited in claim 20 wherein said at least one solder ball is between about 8 and 20 mils in diameter.

23. The integrated circuit package as recited in claim 22 wherein said at least one solder ball is about 10 mils in diameter.

24. The integrated circuit package as recited in claim 22 wherein said at least one solder ball is about 15 mils in diameter.

25. The integrated circuit package as recited in claim 20 wherein said chip has a thickness between about 10 and 20 mils.

26. The integrated circuit package as recited in claim 20 wherein said chip has a thickness of about 14 mils.

27. The integrated circuit package as recited in claim 20 wherein said potting material encapsulates said chip and wherein said potting material has a thickness of about 6 mils.

28. The integrated circuit package as recited in claim 20 wherein said substrate has a thickness of between about 8 and 28 mils.

29. The integrated circuit package as recited in claim 28 wherein said substrate has a thickness of about 12 mils.

30. The integrated circuit package as recited in claim 28 wherein said substrate has first and second layers and wherein said first layer has a thickness of about 12 mils and said second layer has a thickness of about 8 mils.

31. The integrated circuit package as recited in claim 28 wherein said substrate has first, second and third layers and wherein said first layer has a thickness of about 12 mils, said second layer has a thickness of about 8 mils and said third layer has a thickness of about 8 mils.

32. The integrated circuit package as recited in claim 20 wherein the overall profile of said package is between about 40 mils and 50 mils.

33. The integrated circuit package as recited in claim 20 wherein the profile of said package is about 41 mils.

34. The integrated circuit package as recited in claim 20 wherein the profile of said package is about 44 mils.

35. The integrated circuit package as recited in claim 20 wherein the profile of said package is about 47 mils.

36. The integrated circuit package as recited in claim 20 wherein the profile of said package is about 50 mils.

* * * * *